(12) United States Patent
Park

(10) Patent No.: US 6,849,551 B2
(45) Date of Patent: Feb. 1, 2005

(54) METHOD FOR FORMING ISOLATION REGION IN SEMICONDUCTOR DEVICE

(75) Inventor: Cheol Soo Park, Kyoungki-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 234 days.

(21) Appl. No.: 10/320,124

(22) Filed: Dec. 16, 2002

(65) Prior Publication Data

US 2003/0119326 A1 Jun. 26, 2003

(30) Foreign Application Priority Data

Dec. 20, 2001 (KR) .................................. 10-2001-0081787

(51) Int. Cl.[7] .............................................. H01L 21/302
(52) U.S. Cl. ...................... 438/694; 438/696; 438/697; 438/700; 438/705; 438/717
(58) Field of Search ................................ 438/694, 696, 438/697, 700, 705, 717

(56) References Cited

U.S. PATENT DOCUMENTS

| | | | |
|---|---|---|---|
| 5,286,672 A | | 2/1994 | Hodges et al. |
| 5,854,121 A | * | 12/1998 | Gardner et al. ............. 438/425 |
| 5,960,298 A | * | 9/1999 | Kim ........................... 438/424 |
| 6,004,864 A | * | 12/1999 | Huang et al. ............... 438/433 |
| 6,069,057 A | * | 5/2000 | Wu ............................. 438/424 |
| 6,165,906 A | * | 12/2000 | Bandyopadhyay et al. . 438/700 |
| 6,362,035 B1 | | 3/2002 | Shih et al. |
| 6,579,801 B1 | * | 6/2003 | Dakshina-Murthy et al. ........................... 438/700 |
| 6,624,016 B2 | * | 9/2003 | Wu ............................. 438/221 |
| 6,727,569 B1 | * | 4/2004 | Gardner et al. ............. 257/513 |

* cited by examiner

*Primary Examiner*—Nadine G. Norton
*Assistant Examiner*—Binh X Tran
(74) *Attorney, Agent, or Firm*—Timothy J. Keefer; Seyfarth Shaw LLP

(57) ABSTRACT

Disclosed is a method for forming an isolation region in a semiconductor device. Pad oxide and nitride films are sequentially formed on a silicon substrate. Photoresist pattern is formed on the pad nitride film, the photoresist pattern. Respectively predetermined parts of the pad oxide and nitride films and the silicon substrate are etched by using the photoresist pattern as a mask to form a shallow trench. Field implant process is performed on a lower surface of the shallow trench, by using the photoresist pattern as a mask to form a field stop implant film. Photoresist pattern is removed. The inside of the shallow trench is washed. The inside of the shallow trench is thermally enlarged to form a first oxide film. Second oxide film is deposited on the first oxide film and chemical mechanical polishing process for the second oxide film is performed to form the isolation region.

6 Claims, 2 Drawing Sheets

METHOD FOR FORMING ISOLATION REGION IN SEMICONDUCTOR DEVICE

BACKGROUND OF THE INVENTION

1. Field of the Invention

The present invention relates to a method for forming an isolation region in a semiconductor device, and more particularly to a method for forming an isolation region in a semiconductor device which allows easy performance of a shallow trench isolation (hereinafter referred to "STI") dry etching process and maximizes the isolation effect by reducing trench depth to a third of the conventional trench depth and performing a field stop implant process during the formation of an STI to implant a high density of impurity ions which results in an increase in field threshold voltage, and reduces damage of silicon by plasma through enlarging a field of an area which is more than 5 times as thick as an oxide film of an STI sidewall due to a doping density difference, wherein the area is an area into which a high density of impurity ions is implanted.

2. Description of the Prior Art

As generally known in the art, in addition to the advance of semiconductor technology, high speed operation and high integration of semiconductor devices are in progress. Accordingly, fine adjustment and a high integration of pattern have been necessarily required. These are required for a device isolation region, which has a wide area within a semiconductor device.

A number of methods are known for decreasing the size of an isolation region of isolating semiconductor devices, and correspondingly increasing the size of an active area of the semiconductor devices. A local oxidation of silicon (hereinafter referred to "LOCOS") process has been widely employed to form the isolation region in a semiconductor device. The LOCOS process is commonly used because of its simplicity and excellent reproducibility.

However, the LOCOS process forms a "bird's beak" at an edge of the isolation region, which results in an increase in the size of the isolation region and generates a leakage current.

Accordingly, in order to solve the above problems of the LOCOS process, a method for forming a shallow trench isolation (STI) region has been proposed. The STI region has a narrow width and an excellent isolation property. A conventional method for forming an STI isolating region will be described with reference to FIG. 1.

FIG. 1 is a sectional view which illustrates a conventional method for forming a shallow trench isolation element isolating film.

As shown in FIG. 1, a buffer pad oxide film 2 and a pad nitride film 3 are sequentially formed on a silicon substrate 1. The pad nitride film 3 functions as an oxidization inhibiting film. Then, a photoresist film 4 is coated on the pad nitride film 3 to define an isolation forming region, and is patterned and selectively removed after an exposure and development processes. At this time, a deep ultra violet (DUV) light source having an excellent resolution is used for forming the photoresist film 4 so as to form an isolating region having a narrow width. Subsequently, with the patterned photoresist film 4 serving a mask, the pad nitride film 3 and the buffer pad oxide film 2 are sequentially etched by respectively predetermined depths, and then the silicon substrate 1 is etched by a predetermined depth to from a shallow trench (ST). The patterned photoresist film 4 is removed by a known method, and an insulating film (not shown) is buried in the ST. The pad nitride film 3 and the pad oxide film 2 formed on a surface of the silicon substrate 1 are removed by a method known in the art to form a complete STI region.

The conventional method for forming an STI region has excellent electric properties. However, since the conventional method has deep trenches, it is a great burden when performing dry etching. Since an aspect ratio (i.e., the ratio of depth to width) and a micro-loading effect are increased in the range of of up to 0.10 $\mu$m trench width, it is difficult to perform dry etching. As the trench becomes deeper, the aspect ratio of the dry etching is increased causing an isolation short.

SUMMARY OF THE INVENTION

Accordingly, the present invention has been made to solve the above-mentioned problems occurring in the prior art, and an object of the present invention is to provide a method for forming an isolation region in a semiconductor device, which allows the easy performance of an STI dry etching process and which allows maximization of the isolation effect by reducing trench depth to a third of the conventional trench depth and performing a field stop implant process during the formation of an STI by implanting a high density of impurity ions which results in an increase in field threshold voltage.

It is another object to provide a method for forming an element isolating film in a semiconductor device capable of reducing a leakage current generated in a cell, through reduction of a defect produced when a side wall and a bottom of an STI are exposed to plasma, by reducing trench depth during the formation of an STI.

It is a further object to provide a method for forming an element isolating film in a semiconductor device allowing a reduction of trench depth to a third of the conventional trench depth, a reduction of damage to silicon by plasma, through enlarging field of an area to be more than 5 times as thick as an oxide film of an STI sidewall due to a doping density difference during the formation of an STI, wherein the area is an area into which a high density of impurity ions are implanted by means of a field stop implant process.

In order to accomplish these objects, there is provided a method for forming an isolation region the method comprising the steps of: sequentially forming pad oxide and nitride films on a silicon substrate; forming a photoresist pattern on the pad nitride film, the photoresist pattern defining an isolation region to be formed; etching each predetermined part of the pad oxide and nitride films and the silicon substrate by using the photoresist pattern as a mask to form a shallow trench; performing a field implant process on a lower surface of the shallow trench by using the photoresist pattern as a mask to form a field stop implant film; removing the photoresist pattern; washing an inside of the shallow trench; thermally growing the inside of the shallow trench to form a first oxide film; and depositing a second oxide film on the first oxide film and performing a chemical mechanical polishing process for the second oxide film to form the isolating region.

Preferably, the first oxide film arranged at the lower surface of the shallow trench is 5 to 10 times thicker than that arranged at a side wall of the shallow trench. Preferably, the first oxide film is formed by means of a field stop implant process. Preferably, a field stop implant film formed on a lower surface of the shallow trench by the field stop implant process has a high density which is more than $10^{15}$ atoms/cm$^2$. Preferably, dry and wet oxidizing processes for the first oxide film are separately formed. Preferably, during the field stop implant process, impurity ions having a lower density are implanted in order to increase a threshold voltage of a field.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
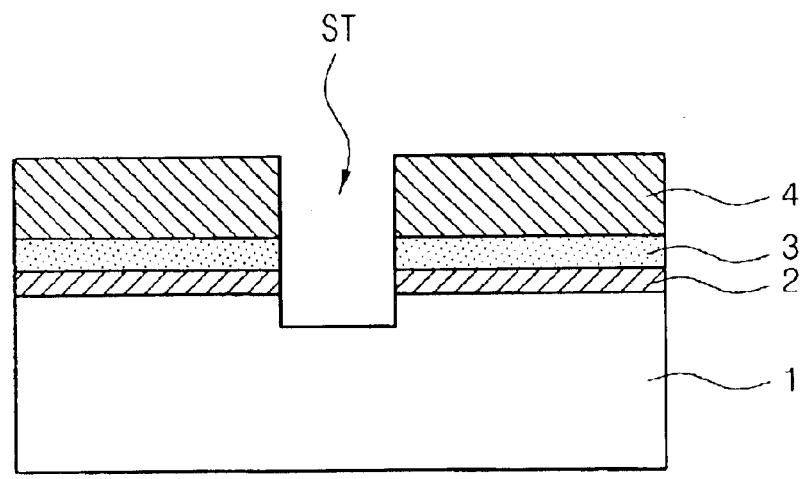
FIG. 1 is a sectional view which illustrates a conventional method for forming a shallow trench isolation element isolating film.

Hereinafter, a preferred embodiment of the present invention will be described with reference to the accompanying drawings. In the following description and drawings, the same reference numerals are used to designate the same or similar components, so repetition of the description of the same or similar components will be omitted.

FIGS. 2a through 2d are sectional views which illustrate a method for forming an STI region according to the present invention.

Figure 2A:
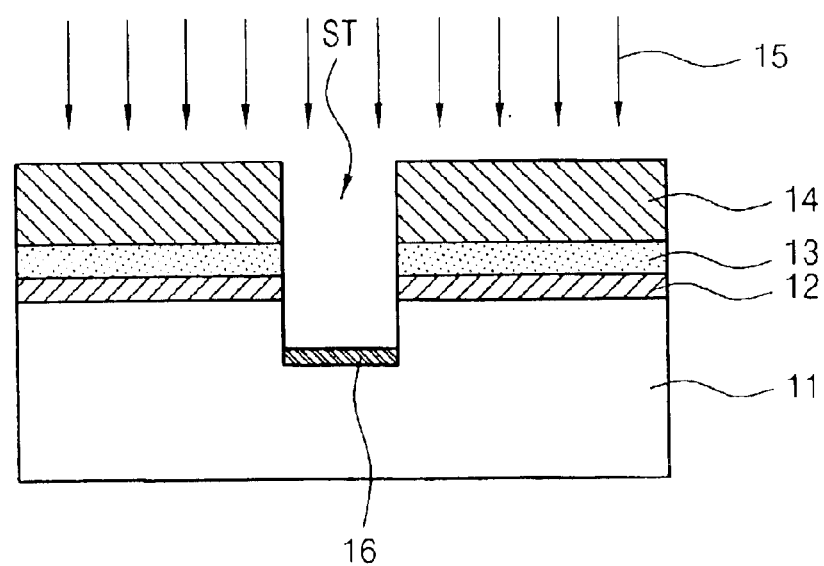
FIGS. 2a through 2d are sectional views which illustrate a method for forming an STI element isolating film according to the present invention.

Referring to FIG. 2a, a first buffer pad oxide film 12 and a pad nitride film 13 are sequentially formed. The pad nitride film 13 functions as an oxidization inhibiting film. A photoresist pattern 14 is formed on the pad nitride film. The photoresist pattern defines an isolation area to be formed. A deep ultra violet(DUV) light source having an excellent resolution is used for forming the photoresist pattern 14 so as to form an isolation region having a narrow width.

Subsequently, with the photoresist pattern 14 serving as a mask, the pad nitride film 13 and the first buffer pad oxide film 12 are sequentially etched to respectively predetermined depths, and then the silicon substrate 11 is etched to a predetermined depth to form a shallow trench (hereinafter referred to "ST").

By performing a field stop implant process on the silicon substrate 11 in which the ST is formed, a field stop implant film 16 is formed in the lower surface of the ST and on the silicon substrate.

Figure 2B:
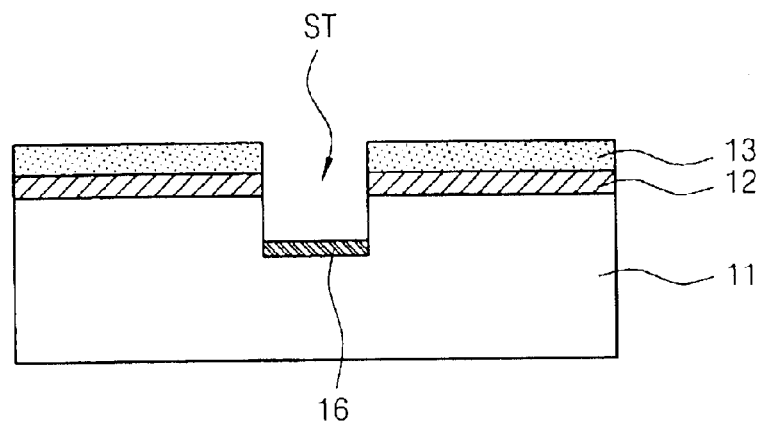

Thereafter, as shown in FIG. 2b, the photoresist pattern 14 is removed by means of a method known in the art and the inside of the ST is washed.

Figure 2C:
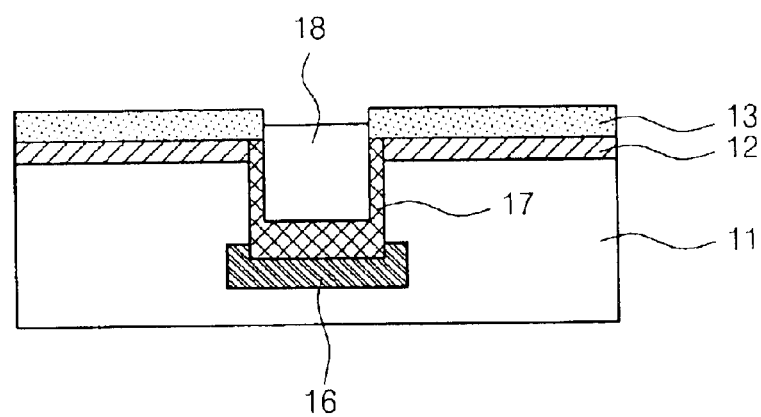

Then, as shown in FIG. 2c, the inside of the ST is thermally enlarged to form a second pad oxide film 17.

At this time, a field stop implant process is performed by implanting high-density impurity ions of more than $10^{15}$ atoms/cm$^2$ into the second pad oxide film 17 in such a way that the second pad oxide film 17 arranged at the lower surface of the ST is more than 5 times as thick as that arranged at a sidewall of the ST, due to the doping density difference.

Also, dry and wet oxidizing processes for the second pad oxide film 17 are separately performed in order to improve a rounding at a top corner of the ST. Accordingly, a hump of a transistor is controlled, and thinning of the gate insulating film is prevented.

A third pad oxide film 18 is thickly deposited on the first oxide film 17 to gap-fill the inside of the ST. A chemical mechanical polishing process or a blanket etchback process for the third pad oxide film 18 is performed to planarize the second pad oxide film 18 so that the pad nitride film 13 is exposed.

Figure 2D:
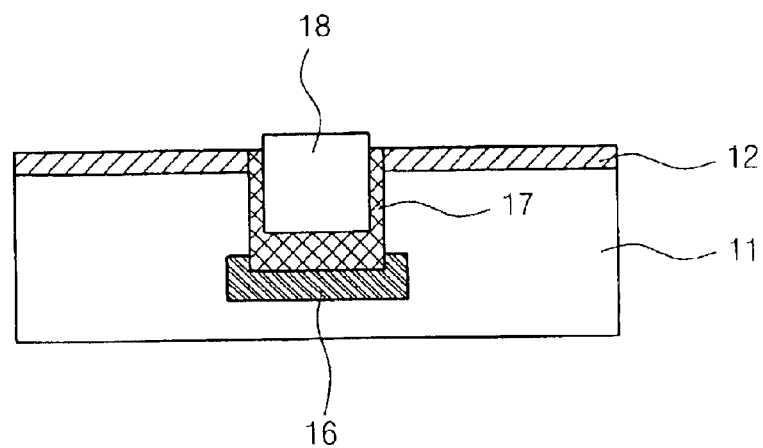

Then, as shown in FIG. 2d, the pad oxide film 13 is removed with a hot phosphoric etchant to finish a process for manufacturing an isolating region.

In the present invention, by implanting low density of impurity ions in a field stop implant process, only the field threshold voltage Vt is increased.

As mentioned above, according to the present invention, by reducing trench depth to a third of the conventional trench depth and performing a field stop implant process to implant high density of impurity ions which result in an increase in a field threshold voltage during the formation of an STI, an STI dry etching process is easily performed, and the isolation effect is maximized.

Also, by reducing trench depth during the formation of an STI, a leakage current generated in a cell due to a reduction of a defect produced is reduced when a side wall and the bottom of an STI are exposed to a plasma.

Further, damage of silicon due to the plasma is reduced by enlarging field of an area which is more than 5 times as thick as an oxide film of an STI sidewall due to a doping density difference during the formation of an STI, wherein the area is an area into which high density of impurity ions are implanted by means of the field stop implant process.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming an isolation region the method comprising the steps of:
    sequentially forming pad oxide and nitride films on a silicon substrate;
    forming a photoresist pattern on the pad nitride film, the photoresist pattern defining an isolation region to be formed;
    etching respectively predetermined parts of the pad oxide and nitride films and the silicon substrate, by using the photoresist pattern as a mask to form a shallow trench;
    performing a field implant process on a lower surface of the shallow trench by using the photoresist pattern as a mask to form a field stop implant film;
    removing the photoresist pattern;
    washing inside the shallow trench;
    thermally enlaring the inside of the shallow trench to form a first oxide film; and
    depositing a second oxide film on the first oxide film and performing a chemical mechanical polishing process for the second oxide film to form the isolation region.

2. The method as claimed in claim 1, wherein during the field stop implant process, an impurity ion is implanted in order to increase threshold voltage of field.

3. The method as claimed in claim 1, wherein the first oxide film is formed by means of a field stop implant process.

4. The method as claimed in claim 3, wherein a field stop implant film formed on a lower surface of the shallow trench by the field stop implant process has a high density which is more than $10^{15}$ atoms/cm$^2$.

5. The method as claimed in claim 1, wherein the first oxide film arranged at the lower surface of the shallow trench is 5 to 10 times thicker than that arranged at a side wall of the shallow trench.

6. The method as claimed in claim 5, wherein dry and wet oxidizing processes for the first oxide film are separately performed.

* * * * *